United States Patent [19]

Ellwanger

[11] Patent Number: 4,594,769
[45] Date of Patent: Jun. 17, 1986

[54] METHOD OF FORMING INSULATOR OF SELECTIVELY VARYING THICKNESS ON PATTERNED CONDUCTIVE LAYER

[75] Inventor: Russell C. Ellwanger, Felton, Calif.

[73] Assignee: Signetics Corporation, Sunnyvale, Calif.

[21] Appl. No.: 621,001

[22] Filed: Jun. 15, 1984

[51] Int. Cl.⁴ .......................................... H01L 21/465
[52] U.S. Cl. ...................................... 29/578; 29/580; 148/187; 156/657
[58] Field of Search ............ 148/1.5, 187; 29/576 W, 29/578, 580; 156/657

[56] References Cited

U.S. PATENT DOCUMENTS

| 3,962,779 | 6/1976 | Edwards et al. | 29/577 |
| 4,025,411 | 5/1977 | Hom-Ma et al. | 204/192 E |
| 4,044,454 | 8/1977 | Magdo | 148/187 X |

FOREIGN PATENT DOCUMENTS

| 12863 | 11/1979 | European Pat. Off. |
| 83467 | 7/1978 | Japan |
| 129970 | 11/1978 | Japan |
| 48140 | 5/1981 | Japan |
| 108264 | 8/1981 | Japan |
| 50436 | 3/1982 | Japan |

OTHER PUBLICATIONS

Adams et al., *J. Electrochem. Soc.: Solid-State Sci. and Tech.*, vol. 128, No. 2, Feb. 1981, pp. 423–429.
Oh et al., *Extended Abstracts: 164th Electrochem. Soc. Meeting*, vol. 83-2, Wn., D.C., Oct. 9–14, 1983, pp. 327 and 328.
Fried et al., *IBM J. Res. Develop.*, vol. 26, No. 3, May 1982, pp. 362–371.

Primary Examiner—George T. Ozaki
Attorney, Agent, or Firm—R. J. Meetin; J. Oisher; R. Mayer

[57] ABSTRACT

A structure having substantial surface evenness is created by a method in which an insulating layer (24) that has an upward protrusion (26) is formed on a patterned conductive layer (20) having a corresponding upward protrusion (22). A further layer (28) having a generally planar surface is formed on the insulating layer. Using an etchant that attacks the further layer much more than the insulating layer, the further layer is etched to expose at least part of the insulating protrusion. The further layer and the insulating layer (as it becomes exposed) are then etched with an etchant that attacks both of them at rates not substantially different from each other. This brings the upper surface down without exposing the conductive layer, particularly its upward protrusion.

16 Claims, 10 Drawing Figures

METHOD OF FORMING INSULATOR OF SELECTIVELY VARYING THICKNESS ON PATTERNED CONDUCTIVE LAYER

FIELD OF USE

This invention relates to methods employable in manufacturing semiconductor devices and more particularly to methods for forming insulating layers on conductive layers.

BACKGROUND ART

A conventional technique for separating active semiconductor regions along the upper surface of a silicon wafer is oxide isolation in which a thick insulating field region of silicon dioxide is grown laterally around the active regions. Along the edge of each active region in some devices, the field-oxide isolation region is in the shape of a bird's head which protrudes upward beyond adjacent parts of the oxide and silicon regions.

Electrical contact to selected parts of the active regions is made with a patterned conductive layer that overlies the oxide and silicon regions. The conductive layer is typically created by depositing a metal layer on the top of the structure and then removing undesired parts of the metal. As a result, there are at least two changes in height along the resulting upper surface. One height change extends from the top of the metal portion above the bird's head to the top of the adjacent metal. Another height change is at the lateral edges of the remaining metal.

If another patterned metal layer is to be used, an insulating layer is first deposited on the upper surface of the structure. The profile of the top of the insulating layer generally reflects the profile of the first metal layer. For example, see R. Edwards et al, U.S. Pat. No. 3,962,779, which shows that the top of the insulating layer reaches a maximum height above the bird's head and drops to a minimum height in areas beyond the edges of the first metal layer. This surface roughness creates difficulty in providing good coverage with the second metal layer.

Surface unevenness in this type of structure can be reduced by removing some or all of the bird's head. Y. Hom-Ma et al disclose one way of doing this in U.S. Pat. No. 4,025,411. In Hom-Ma et al, a layer of photoresist is formed on the bird's head and on the adjacent parts of the structure in such a manner that the upper photoresist surface is largely planar. The structure is then subjected to a sputter etching in which the photoresist and silicon dioxide are attacked at close to the same rates. Consequently, the bird's head is removed without removing adjacent parts of the oxide isolation region. While surface roughness is reduced, the etching must be controlled quite carefully to avoid penetration into the active regions.

Hom-Ma et al also use a similar technique in planarizing an insulating layer formed on a patterned metal layer lying on a flat surface. No bird's head is present. A polymeric layer having a largely planar upper surface is formed on the metal and on adjacent parts of the insulating layer. The structure is then ion milled so as to bring the planar surface downward until the metal is exposed. Although this technique may be useful in some limited applications, it does not extend to the situation in which the first metal overlies a bird's head and must be electrically separated from part of an overlying second metal layer.

DISCLOSURE OF THE INVENTION

In accordance with the invention, a structure is fabricated by a method that improves surface evenness without sacrificing electrical insulation capability. The present method is particularly applicable to oxide-isolated semiconductor devices where birds' heads cause surface roughness but also applies to other situations in which there are similar surface irregularities.

In the present method, a body is provided with a patterned first electrically conductive layer having a portion protruding upward beyond adjacent parts of the conductive layer. The protruding part of the conductive layer may, for example, result from the bird's head of an oxide-isolated region. An electrically insulating layer is formed on the conductive layer and on adjacent parts of the body. The portion of the insulating layer at the location of the protruding part of the conductive layer similarly protrudes upward.

A further layer having a generally planar upper surface is formed on the insulating layer. This is typically done by depositing a layer of photoresist and heating it until its upper surface becomes largely planar. At least part of the protruding portion of the insulating layer is then exposed by etching the further layer with an etchant that attacks the further layer much more than the insulating layer. The etching is normally terminated before exposing parts of the insulating layer adjacent to its protruding portion.

The further and insulating layers are then etched with an etchant that attacks these two layers at rates that are not substantially different. The upper surface of the structure thereby moves generally downward. This etching is normally terminated before any part of the conductive layer is exposed. Consequently, the upper insulating surface is largely planar except above the protruding portion of the conductive layer where the upper insulating surface generally conforms to the upper surface of the conductive layer.

One or more vias may now be etches through the remainder of the insulating layer down to the conductive layer. Because the remainder of insulating layer is thicker beyond the lateral edges of the conductive layer than above it, the vias(s) can be made oversize—i.e., wider than the underlying part(s) of the conductive layer—without going through the insulating material at the sides of the conductive layer. This avoids unwanted penetration into the material below the insulating layer. A patterned second conductive layer is then formed on the remainder of the insulating layer. The conductive layers selectively contact each other through the vias(s). If no contact between certain parts of the conductive layers is desired at the protruding portion of the first conductive layer, the conforming portion of the remainder of the insulating layer provides the requisite separation.

BRIEF DESCRIPTION OF THE DRAWINGS

FIGS. 1e, 1f, and 1g are cross-sectional structural side views taken respectively through planes 2e—2e, 2f—2f, and 2b—2g in FIGS. 1e-1g. Likewise, FIGS. 1e-1f are taken respectively through planes 1e—1e, 1f—1f, and 1g—1g in FIGS. 2e-2g.

Like reference symbols are employed in the drawings and in the description of the preferred embodiment to represent the same or very similar item or items.

DESCRIPTION OF THE PREFERRED EMBODIMENT

Figure 1A:
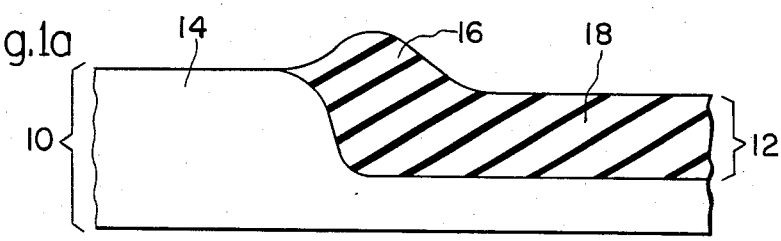
FIGS. 1a, 1b, 1c, 1d, 1e, 1f, and 1g are cross-sectional front views of a semiconductor structure representing stages in its manufacture according to the invention.

Referring to the drawings, FIGS. 1a–1g illustrate front views for steps in manufacturing an oxide-isolated semiconductor structure having a highly planar character that facilitates usage of multiple conductive layers. FIGS. 2e–2g show side views of the steps depicted respectively in FIGS. 1e–1g. Unless otherwise indicated the following operations are performed at atmospheric pressure and room temperature (about 25° C.).

The starting material is a semiconductor body 10 having a monocrystalline silicon substrate doped with suitable P-type and/or N-type semiconductor impurities. Body 10 may have an epitaxial layer (not explicitly shown in the drawings) along the top of the substrate.

A thick electrically insulating region 12 of silicon dioxide having a thickness of about 1.4 microns is grown along the upper surface of body 10 according to conventional techniques so as to laterally surround an active semiconductor region 14 and thereby isolate it from other such active semiconductor regions. This is typically done by forming a silicon oxynitride layer along the upper surface of body 10, forming grooves through the oxynitride layer and into the underlying silicon at the intended location for oxide-isolation region 12, and then heating the structure to grow region 12. In subsequent steps, the oxynitride layer is removed and various N-type and/or P-type regions (not shown) are formed in region 14. Any material that is not monocrystalline silicon is removed from the top of region 14. This leads to the structure depicted in FIG. 1a.

As a result of the oxide-isolation process, field-oxide region 12 has an upward-protruding portion 16 in the shape of a bird's head along the edge of region 14. Bird's head 16 protrudes about 0.4 micron above the adjacent main part 18 of insulator 12 and several hundred Angstroms less than this above active region 14.

Figure 1B:
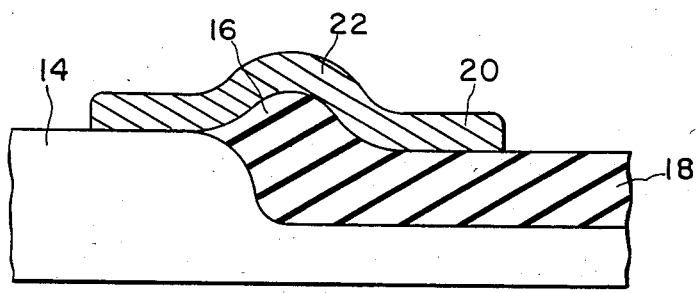
Figure 2E:
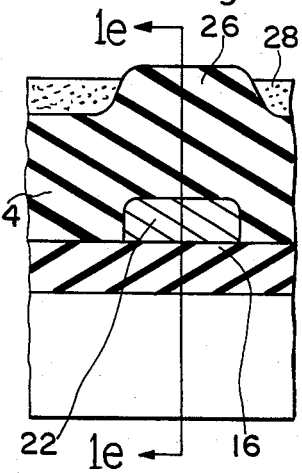
Figure 2F:
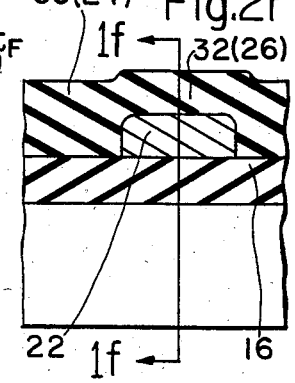
Figure 2G:
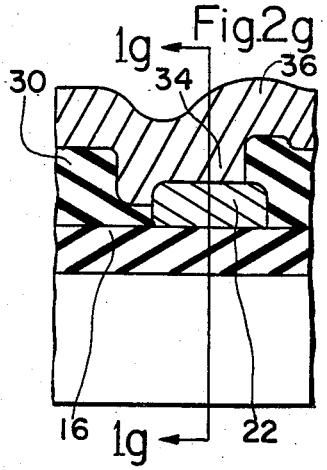

A patterned electrically conductive layer 20 having a thickness of about 0.5 micron is formed over bird's head 16 and the adjacent parts of regions 14 and 18 as shown in FIG. 1b. Conductive layer 20 is created by depositing a metal layer such as an alloy of aluminum with 0.5% copper on the entire upper surface of the structure, forming a photoresist mask over the intended location for layer 20, and removing the undesired parts of the metal layer with an etchant such as a plasma consisting of boron trichloride and chlorine. In FIG. 1b, layer 20 is a conductive line extending parallel to the plane of the figure. Because of bird's head 16, a portion 22 of layer 20 protrudes upward beyond the adjacent parts of layer 20.

Figure 1C:
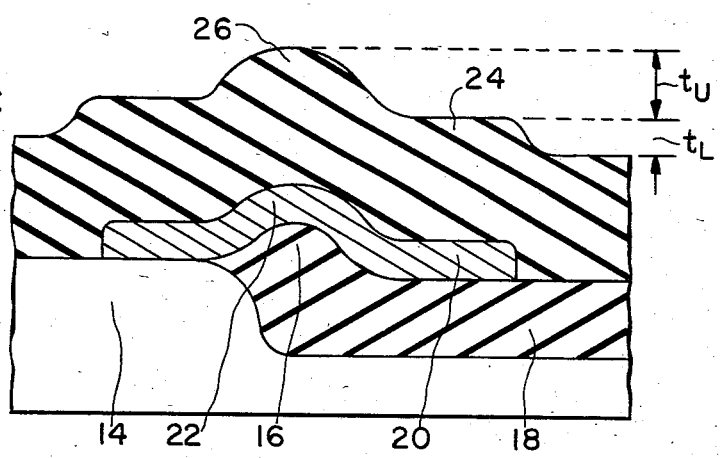

An electrically insulating layer 24 of silicon dioxide with about 12% phosphorus pentoxide is chemically vapor deposited on the entire top surface of the structure as illustrated in FIG. 1c. Phospho-silicate glass (PSG) layer 24 has an average thickness of 1.4 micron. Because this deposition is done at atmospheric pressure, slightly more PSG accumulates above metal protrusion 22. As a result, dielectric layer 24 has an upward protruding part 26 having a thickness of about 1.55 microns above metal protrusion 22. A height difference $t_U$ of about 0.55 micron thereby exists between the top of oxide protrusion 26 and the top of the adjacent part of insulator 24 overlying conductor 20 above main field-oxide part 18. The steps at the edges of conductor 20 are largely reflected in insulating layer 24. Accordingly, a height difference $t_L$ of about 0.5 micron exists between the top of the part of layer 24 contacting main insulating part 18 and the top of the adjacent part of layer 24 above layer 20.

Figure 1D:
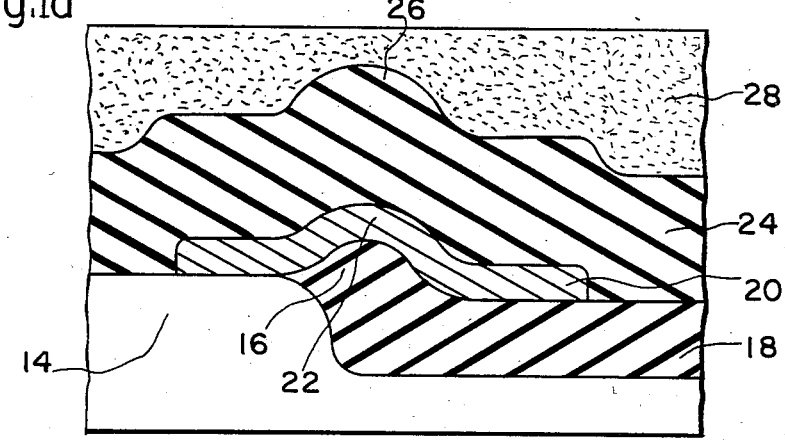

About 1.2 microns of Hunt's Positive Photoresist 204 is deposited on the entire upper surface of dielectric 24. The photoresist is soft baked at 103° C. for 30 minutes and flood exposed. The photoresist is then heated at 200° C. for 30 minutes. This causes the photoresist to flow until it becomes a layer 28 having a largely planar upper surface as indicated in FIG. 1d.

Figure 1E:
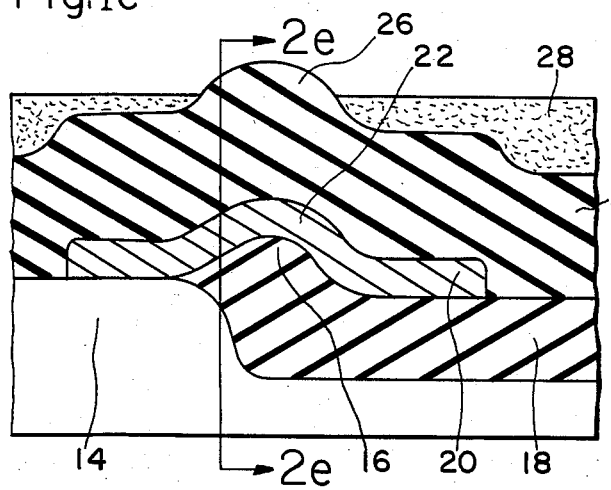

The structure is placed in an AME 8110 hexoidal plasma reactor made by Applied Materials, Inc. The reactor is evacuated to a pressure of 80 millitorr. The structure is subjected for 5.5 minutes to a plasma consisting of oxygen at a flow rate of 80 standard cm$^3$/min (SCCM). The RF power for the reactor is 1,350 watts. The oxygen plasma attacks the photoresist in layer 28 much (effectively infinitely) more than the PSG in layer 24. As illustrated in FIGS. 1e and 2e, a part of protrusion 26 is thereby exposed as photoresist layer 28 is etched downward. The exposed part of protrusion 26 extends about 0.35 micron above the resulting upper surface of the remander of layer 28.

Figure 1F:
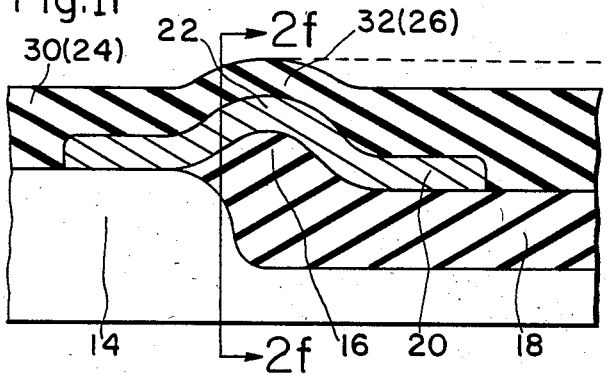

While the structure is still in the plasma reactor, the structure is subjected for 14 minutes to a plasma consisting of oxygen at a flow rate of 33 SCCM and carbon tetrafluoride at 47 SCCM. The RF power remains at 1,350 watts. The oxygen/carbon tetrafluoride plasma attacks the photoresist and PSG at very close to the same rate. The upper surface material of photoresist layer 28 and insulating layer 24 as it becomes exposed is progressively removed. The upper surface moves downward approximately equal amounts at all points until the structure of FIGS. 1f and 2f is achieved.

The steps at the edge of conductor 20 are not reflected in the remainder 30 of dielectric 24. The remaining part 32 of insulating protrusion 26 largely conforms to the upper surface of conductive protrusion 22. The height different $t_F$ between the lowest and highest parts of the upper insulating surface is only about 0.35 micron. Insulator 30 thereby has a thickness varying from a minimum of about 0.9 micron at part 32 to a maximum of about 1.4 micron where dielectric 30 adjoins main field-oxide part 18. The oxide thickness is also about 1.4 micron where dielectric 30 adjoins active region 14.

Figure 1G:
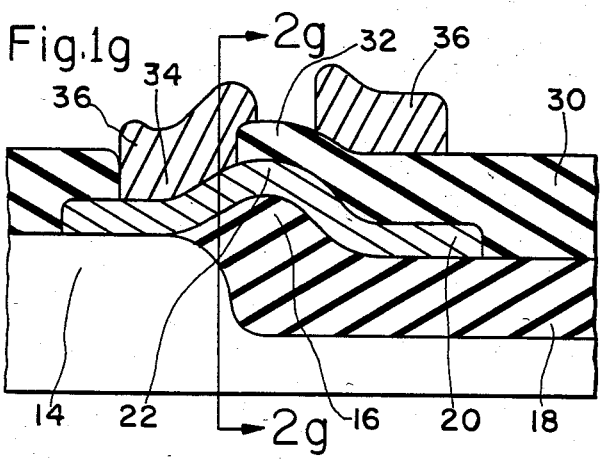

Vias represented by a via 34 in FIG. 1g are now opened through insulator 30 down to conductor 20 at selected locations along the upper structural surface. The vias are typically created by forming a photoresist mask, etching through holes in the photoresist mask with a combination of a conventional hydrofluoric acid solution for 2.5 minutes and a CHF$_3$/CO$_2$/He plasma for 3 minutes, and then removing the photoresist mask. As indicated in FIG. 2g where via 34 is shown as slightly misaligned, the vias may be made oversize without going entirely through insulator 30 at the sides of conductor 20. The greater thickness of layer 30 beyond the edges of layer 20 provides the necessary etching safety margin.

A patterned electrically conductive layer 36 having a thickness of 1.0 micron is formed over the upper structural surface. Conductive layer 36 is created by depositing a metal layer such as an alloy of aluminum with 0.5% copper over the entire upper surface, forming a photoresist mask over the intended location for layer 36, and then removing the undesired parts of the metal layer with the aluminum etchant described above. FIG. 1g shows two parts of layer 36, each part being a conductive line lying partly above bird's head 16 and extending perpendicular to the plane of the figure. One of these lines contacts the protruding conductive portion 22 through via 34 while the other is insulated from protrusion 22 by protruding insulating portion 32. The structure may now be finished in a conventional manner.

While the invention has been described with reference to a particular embodiment, this description is solely for the purpose of illustration and is not to be construed as limiting the scope of the invention claimed below. For example, insulator 24 could be formed at a largely constant thickness everywhere. The largely planar upper surface for layer 28 could be created by techniques other than the deposition/heating techniques described above. Materials other than photoresist could be used to form layer 28. Doped polycrystalline silicon could be used instead of a metal alloy for each of conductors 20 and 36. Thus, various modifications, changes, and applications may be made by those skilled in the art without departing from the true scope and spirit of the invention as defined by the appended claims.

What is claimed is:

1. A manufacturing method in which: a body is provided with a patterned first electrically conductive layer having a portion protruding upward beyond adjacent parts of the conductive layer; and an electrically insulating layer is formed on the conductive layer and on adjacent parts of the body such that a portion of the insulating layer protrudes upward beyond adjacent parts of the insulating layer generally at the location above the protruding portion of the conductive layer; characterized by the steps of:
   forming on the insulating layer a further layer having a generally planar upper surface;
   exposing at least part of the protruding portion of insulating layer by etching the further layer with a first etchant that attacks material of the further layer much more than material of the insulating layer; and
   etching the remainder of the further layer and the insulating layer as it becomes exposed with a second etchant that attacks material of the insulating and further layers at rates not substantially different from each other.

2. A method as in claim 1 characterized in that the step of exposing is terminated before exposing parts of the insulating layer adjacent to its protruding portion.

3. A method as in claim 2 characterized in that the step of etching is terminated before exposing any part of the conductive layer.

4. A method as in claim 3 characterized by the steps of:
   opening a via through the remainder of the insulating layer down to the conductive layer; and
   providing the remainder of insulating layer and the exposed part of the conductive layer with a second patterned electrically conductive layer.

5. A method as in claim 4 characterized in that the via is made oversize but that the step of opening is terminated before the via extends entirely through the remainder of the insulating layer beyond the edges of the first conductive layer.

6. A method as in claim 1 characterized in that the further layer comprises photoresist.

7. A method as in claim 6 characterized in that the step of forming the further layer comprises the steps of:
   depositing a photoresist layer on the insulating layer; and
   heating the photoresist layer until its upper surface becomes largely planar.

8. A method as in claim 7 characterized in that the insulating layer largely comprises a semiconductor oxide.

9. A method as in claim 8 characterized in that the first etchant is a plasma comprising oxygen.

10. A method as in claim 9 characterized in that the second etchant is a plasma comprising oxygen and a halocarbon.

11. A method as in claim 10 characterized in that: the semiconductor oxide comprises silicon dioxide; and the halocarbon comprises carbon tetrafluoride.

12. A method as in claim 1 wherein the body comprises a monocrystalline semiconductor structure having a surface along which a patterned electrically insulating region has an edge portion protruding upward beyond adjacent parts of the structure and insulating region generally at the location of the protruding portion of the conductive layer, characterized in that the thickness of the conductive layer is largely constant.

13. A method as in claim 12 characterized in that the insulating layer is formed by chemical vapor deposition 14. A method as in claim 13 characterized in that the insulating layer is formed at atmospheric pressure.

15. A method as in claim 14 characterized in that the protruding portion of the insulating layer is thicker than adjacent parts of the insulating layer.

16. A method as in claim 15 characterized in that the insulating layer is formed at largely constant thickness.

* * * * *